United States Patent
Ling et al.

(10) Patent No.: US 6,975,669 B2
(45) Date of Patent: *Dec. 13, 2005

(54) SYSTEM AND METHOD FOR PERFORMING ACCURATE DEMODULATION OF TURBO-ENCODED SIGNALS VIA PILOT ASSISTED COHERENT DEMODULATION

(75) Inventors: Fuyun Ling, San Diego, CA (US); Nagabhushana T. Sindhushayana, San Diego, CA (US); Eduardo A. S. Esteves, Del Mar, CA (US)

(73) Assignee: Qualcomm, Incorporated, San Diego, CA (US)

( * ) Notice: Subject to any disclaimer, the term of this patent is extended or adjusted under 35 U.S.C. 154(b) by 522 days.

This patent is subject to a terminal disclaimer.

(21) Appl. No.: 10/050,338

(22) Filed: Jan. 15, 2002

(65) Prior Publication Data

US 2002/0097785 A1 Jul. 25, 2002

Related U.S. Application Data

(63) Continuation of application No. 09/311,793, filed on May 13, 1999, now Pat. No. 6,377,607.

(51) Int. Cl.[7] .............................................. H04B 1/707
(52) U.S. Cl. ...................................... 375/141; 375/340
(58) Field of Search ................................ 375/130, 140, 375/141, 144, 148, 262, 265, 340, 341, 349, 346

(56) References Cited

U.S. PATENT DOCUMENTS 6,078,626 A * 6/2000 Ramesh ...................... 375/262
6,201,954 B1 * 3/2001 Soliman ................... 455/226.2
6,377,607 B1 * 4/2002 Ling et al. .................. 375/130

OTHER PUBLICATIONS

M.C. Valenit, et al. "Refined Channel Estimation for Coherent Detection of Turbo Codes Over Flat–Fading Channels," Electronics Letters, GB, IEEE Stevenage, vol. 34, No. 17, Aug. 20, 1998. (pp. 1648–1649).

M.C. Valenti, et al. "A Bandwidth Efficient Pilot Symbol Technique for Coherent Detection of Turbo Codes Over Fading Channels," Milcom 1999. IEEE Military Communications Conference Proceedings, Atlantic City, NJ, USA, Oct. 31–Nov. 3, 1999. (pp. 81–85, vol. 1).

* cited by examiner

*Primary Examiner*—Don N. Vo
(74) *Attorney, Agent, or Firm*—Philip Wadsworth; Sandra L. Godsey; S. Hossain Beladi

(57) ABSTRACT

An efficient telecommunications receiver system for accurately decoding a received composite signal having a data signal component and a pilot signal component includes a first circuit for receiving the composite signal and extracting a pilot signal and a data signal from received composite signal. A second circuit calculates a log-likelihood ratio as a function of a channel estimate based on the pilot signal. A third circuit scales the log-likelihood ratio by a predetermined log-likelihood ratio scaling factor and provides an accurate log-likelihood value in response thereto. A fourth circuit decodes the received composite signal based on the accurate log-likelihood value and the data signal. The third circuit includes a carrier signal-to-interference ratio circuit for computing a first signal-to-interference ratio and a second signal-to-interference ratio based partly on the pilot signal.

6 Claims, 7 Drawing Sheets

SYSTEM AND METHOD FOR PERFORMING ACCURATE DEMODULATION OF TURBO-ENCODED SIGNALS VIA PILOT ASSISTED COHERENT DEMODULATION

CROSS REFERENCE

This application claims priority from and is a continuation of application Ser. No. 09/311,793, filed May 13, 1999, now U.S. Pat. No. 6,377,607, issued Apr. 23, 2002, entitled "System and Method for Performing Accurate Demodulation of Turbo-Encoded Signals Via Pilot Assisted Coherent Demodulation" and currently assigned to the assignee of the present application.

BACKGROUND OF THE INVENTION

1. Field of Invention

This invention relates to communications systems. Specifically, the present invention relates to systems and methods for calculating the log-likelihood ratio to facilitate optimal decoding in receivers employing pilot-assisted coherent demodulation.

2. Description of the Related Art

Cellular telecommunications systems are characterized by a plurality of mobile transceivers, such as mobile phones, in communication with one or more base stations. Each transceiver includes a transmitter and a receiver.

In a typical transceiver, an analog radio frequency (RF) signal is received by an antenna and downconverted by an RF section to an intermediate frequency (IF). Signal processing circuits perform noise filtering and adjust the magnitude of the signal via analog automatic gain control (AGC) circuitry. An IF section then mixes the signal down to baseband and converts the analog signal to a digital signal. The digital signal is then input to a baseband processor for further signal processing to output voice or data.

Similarly, the transmitter receives a digital input from the baseband processor and converts the input to an analog signal. This signal is then filtered and upconverted by an IF stage to an intermediate frequency. The gain of the transmit signal is adjusted and the IF signal is upconverted to RF in preparation for radio transmission.

The link between a transmitter and a receiver is a channel. One approach to increasing the information-carrying capacity of a channel between a base station and associated mobile stations is to enhance the signal-to-interference ratio (SIR). The SIR is often expressed as a ratio of the energy per information bit received to the interference density of the received signal. To increase system capacity, receivers in the mobile stations and base stations must effectively operate at lower signal-to-interference ratios (SIRs), or the SIR of the channel must be increased. To increase the SIR, the power of the transmitted signal is often increased, which is costly, increases the interference to other mobiles, and, thus, is impractical in many applications. Alternatively, special coding schemes are often employed in order to reduce the required SIR.

Coding for communications signals involves the addition of redundant information to the signals. By strategically adding redundancy to communications signals transmitted in noisy environments, errors introduced by a noisy channel are reduced to a desired level. As shown by Shannon in 1948, if the information rate of the communications signals is less than the channel capacity, the desired noise level is attainable without a reduction of the information rate. If redundancy is not employed in a noisy environment, error-free performance is difficult or impossible to obtain.

Many encoding and decoding systems are designed to control noise and interference related errors that occur during transmission of information in a communications system. Coding is an important consideration in the design of highly reliable modern digital communications systems.

The ability to operate efficiently in noisy or faded environments is particularly important in code division multiple access (CDMA) wireless communications systems where Raleigh-faded signal environments and co-channel interference from other users are common. Raleigh fading results from Doppler frequency shifts in the received signal due to mobile station movement. Co-channel interference occurs when a CDMA communications system maintains multiple system users, with each additional user contributing incrementally to the co-channel interference. Co-channel interference is typically larger than other forms of channel noise such as additive white Gaussian noise (AWGN).

In a Raleigh-faded signal environment, the power levels of transmitted communications signals fluctuate in accordance with a Raleigh distribution. The power typically fluctuates over a dynamic range of 10 dB to 50 dB. The duration of the fades is a function of the velocity of a mobile station, i.e., cellular telephone, the frequency channel assigned to the mobile station, and overall signal environment. As the velocity of a mobile unit increases, fade duration decreases, leading to shorter error bursts. As the velocity of the mobile unit decreases, fade duration increases, leading to longer error bursts.

To improve the performance of a wireless communications system in a noisy and Raleigh-faded environment, interleavers following signal encoders are often employed. An interleaver spreads the codewords output from an encoder so that individual bits of a given codeword are separated from each other and transmitted at different times. As a result, individual bits of a given code experience independent fading, where the bits affected by an error burst belong to several codewords. At the receiver, the received signal samples are deinterleaved before decoding. Thus, the effect of the error burst is spread over the message so that it is possible to recover the data with the original error-correcting code. Several types of interleavers exist, including diagonal, convolutional, interblock, and block interleavers.

Turbo codes are serial or parallel concatenations of two or more constituent codes, separated by one or more code interleavers. Turbo encoders and decoders are often employed to improve error control and to reduce the required SIR. Turbo codes are often decoded with a relatively efficient iterative algorithm to achieve low error rates at signal-to-noise (SNR) ratios approaching the Shannon limit. As an essential part of the Turbo code, code interleavers and deinterleavers must be inserted between the component code encoders and decoders, respectively. The performance of turbo codes depends on the length and structure of the code interleavers. Good turbo code performance can be achieved by using interleavers having pseudo random structures.

Turbo decoders and convolutional decoders use the log-likelihood ratio (LLR) for the received signal to maximize decoder performance. An LLR is a probability metric used by a decoder to determine whether a given symbol was transmitted given a particular received signal. The LLR requires an accurate estimate of the channel coefficient, which is a measure of a complex scale factor applied to the transmitted signal by the channel. Accurate LLR values are particularly important in turbo decoding applications where the LLR inputs are typically subjected to non-linear operations that can amplify inaccuracies in the LLR values and result in unacceptable decoder performance.

Existing methods for calculating the LLR fail to properly account for uncertainty in the estimate of the channel coefficient, which results in sub-optimal detection and decoding. Conventional receiver systems employing turbo codes achieve optimal decoding only when the channel coefficient is accurately known. However, in practice, the channel coefficient is seldom known exactly, and only a channel estimate is available.

To obtain an estimate of the channel, i.e., channel coefficient, which is typically subjected to Raleigh fading, a reference signal (i.e., a pilot signal) is often broadcast with a data signal. The pilot signal is a predetermined sequence (typically a constant signal) broadcast by the transmitter over the channel to the receiver.

A base station often broadcasts different data signals together with a common pilot signal to be sent to subscribers operating mobile stations within the coverage area of the base station. The mobile stations use the pilot signal to establish the phase and magnitude of a channel estimate, which are necessary for performing coherent detection of the associated data signals. The mobile station also transmits a pilot signal together with its traffic data signal. The mobile's pilot signal is used by the base station to perform coherent demodulation in a similar manner as described above.

The process of recovering a transmitted signal from a received modulated signal using a synchronized oscillator and pilot signal is called pilot assisted coherent demodulation. To achieve effective coherent detection, pilot assisted coherent CDMA communications systems must generate accurate channel estimates from the received pilot signal.

Theoretically, the channel equally impacts both the pilot signal and the data signal. The receiver provides an estimate of the channel coefficient based on the known pilot signal and the received pilot signal and provides an estimate of the channel coefficient in response thereto. The estimate of the channel coefficient is used to calculate the LLR value. However, the channel estimate has an error factor. The error factor may become unacceptably large when the channel is characterized by rapid or deep fades. The resulting inaccuracies are particularly problematic for communications systems employing turbo codes, where inaccuracies in the LLR can result in significantly degraded performance.

Currently, channel estimates are employed in LLR calculation circuits and corresponding methods. Unfortunately, these circuits and methods typically fail to account for uncertainty in the estimate of the channel. The channel is often subjected to deep and rapid Raleigh fading, which can result in erroneous channel estimates and poor decoding performance due sub-optimal log-likelihood ratios based on the channel estimates.

Hence, a need exists in the art for an optimal method for decoding a received signal in systems employing pilot assisted coherent demodulation. There is a further need for an efficient system that can accurately compute the log-likelihood ratio while taking into account uncertainty in the estimate of the channel.

SUMMARY OF THE INVENTION

The need in the art is addressed by the efficient telecommunications receiver system for accurately decoding a received composite signal having data signal and pilot signal components of the present invention. In the illustrative embodiment, the inventive receiver system is adapted for use with a wireless code division multiple access (CDMA) communications system and includes a first circuit for receiving the composite signal and extracting a pilot signal and a data signal from received composite signal. A second circuit calculates a preliminary log-likelihood ratio as a function of a channel estimate based on the pilot signal and/or the data signal. A third circuit scales the preliminary log-likelihood ratio by a predetermined log-likelihood ratio scaling factor and provides an accurate log-likelihood value in response thereto. A fourth circuit decodes the received composite signal based on the accurate log-likelihood value and the data signal.

In a specific embodiment, the pilot signal and the data signal comprise pilot samples and data samples, respectively. The third circuit includes a carrier signal-to-interference ratio circuit for computing a first signal-to-interference ratio and a second signal-to-interference ratio based partly on the data and pilot signals. The first signal-to-interference ratio is based on the data samples, and the second signal-to-interference ratio is based on the pilot samples. The first signal-to-noise ratio and the second signal-to-noise ratio provide input to a scaling factor computation circuit included in the third circuit.

In a more specific embodiment, the first circuit includes a despreader for despreading the received composite signal in accordance with a predetermined spreading function and providing a despread signal in response thereto. The spreading function is a pseudo noise sequence or a Walsh function. The first circuit further includes a decovering circuit that extracts the pilot signal and the data signal from the despread signal. The third circuit includes a circuit for calculating a primary carrier signal-to-interference ratio based on the pilot signal and the data signal and includes a data noise variance estimation circuit for computing a noise variance of the data signal based on the data signal and an energy signal derived from the data signal. The third circuit also includes a divider circuit for computing the primary carrier signal-to-interference ratio as a function of an absolute value of the energy signal and the noise variance of the data signal and a data sample signal-to-noise ratio circuit and a channel estimate signal-to-noise ratio circuit for computing a first signal-to-interference ratio and a second signal-to-interference ratio, respectively, based on the primary signal-to-noise ratio.

The third circuit computes the log-likelihood ratio scaling factor in accordance with the following equation:

$$k = \frac{2}{\left(1 + \frac{\gamma_d}{\gamma_{\hat{\alpha}}} + \frac{1}{\gamma_{\hat{\alpha}}}\right)},$$

where k is the log-likelihood ratio scaling factor; $\gamma_d$ is the first signal-to-interference ratio; and $\gamma_{\hat{\alpha}}$ is the second signal-to-interference ratio.

The second circuit includes a lowpass filter that filters the pilot signal and provides a filtered pilot signal in response thereto as a channel estimate. A first multiplier selectively multiplies the data signal by a complex conjugate of the channel estimate and provides a weighted signal in response thereto. A scaling circuit scales the real part of the weighted signal to yield a preliminary log-likelihood ratio. The third circuit includes an additional multiplier that multiplies the preliminary log-likelihood ratio by the predetermined scale factor and provides the accurate log-likelihood value in response thereto. The second circuit includes a filter that provides a filtered pilot signal having a reduced interference component and a complex conjugate circuit that computes the complex conjugate of the filtered pilot signal.

The third circuit includes a circuit for multiplying the complex conjugate by the data signal to yield a result, which is scaled by a predetermined constant factor to yield a rough log-likelihood ratio. The rough log-likelihood ratio is further scaled by an additional scaling factor, computed in accordance with the above equation, to yield the accurate log-likelihood value.

A path combining circuit optimally combines the data signal and the pilot signal in accordance with an estimate of an interference component of the composite received signal and provides an optimally combined signal to the third circuit in response thereto. The third circuit includes a scaling circuit that multiplies the optimally combined signal by a predetermined factor to yield the accurate log-likelihood value.

Alternatively, an accurate log-likelihood value is computed for each path as described above. A combined log-likelihood value is generated by summing the corresponding log-likelihood values from all paths to be used by a convolutional decoder or turbo decoder.

The third circuit includes a carrier signal-to-interference ratio computation circuit that computes a primary carrier signal-to-interference ratio. The carrier signal-to-interference ratio computation circuit includes an interference estimation circuit that estimates an interference component of the received composite signal. The carrier signal-to-interference ratio computation circuit includes a first section for receiving the composite signal. The composite signal has a desired signal component and an interference and/or noise component. A signal extracting circuit extracts an estimate of the desired signal component from the received signal. A noise estimation circuit provides an accurate noise and/or interference value based on the estimate of the desired signal component and the composite signal.

In the illustrative embodiment, the accurate receiver system further includes a circuit for generating a rate and/or power control message and transmitting the rate and/or power control message to an external transceiver in communication with the efficient receiver system.

The novel design of the present invention is facilitated by the use of the unique scale factor applied to the log-likelihood ratio via the third circuit. The unique scale factor accounts for inherent error involved in estimating the characteristics of the channel based on the pilot signal. By accounting for the uncertainty in the estimate of the pilot signal, the present invention provides an optimal log-likelihood value, which may greatly enhance the performance of communications systems employing turbo decoding and encoding. Furthermore, the unique carrier signal-to-interference ratio computation circuit provides for a more accurate carrier signal-to-interference ratio than was previously available by accurately estimating the noise and interference component of the received signal.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
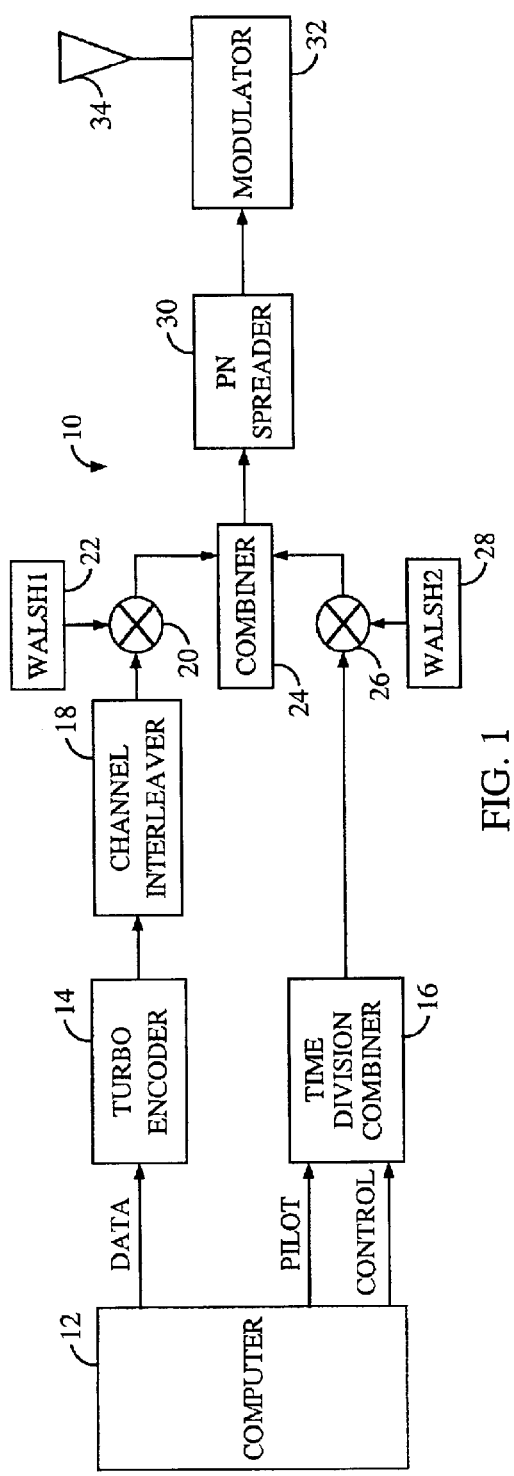
FIG. 1 is a diagram of a code division multiplexing (CDM) transmitter constructed in accordance with the teachings of the present invention.

FIG. 1 is a diagram of a code division multiplexing (CDM) transmitter 10 constructed in accordance with the teachings of the present invention. For clarity, various details of the transmitter have been omitted from the drawings such as timing circuitry, filters, and amplifiers. The omitted circuitry is easily constructed an implemented by those having ordinary skill in the art.

The transmitter 10 includes a computer 12 that includes transmitter software executed via a baseband processor (not shown) within the computer 12. The computer 12 is connected to a turbo encoder 14 and a time division combiner 16. The turbo encoder is connected to a channel interleaver 18, which is connected to a first input of a first multiplier 20. A first Walsh function generator 22 is connected to a second input of the first multiplier 20. An output of the first multiplier 20 is connected to a first input of a combiner 24.

An output of the time division combiner 16 is connected to a first input of a second multiplier 26, a second input of which is connected to a second Walsh function generator 28. An output of the second multiplier 26 is connected to a second input of the combiner 24. An output of the combiner 24 is connected to a quadrature pseudo noise sequence (PN) spreader 30. An output of the PN spreader is input to a modulator 32 that is connected to an antenna 34.

In operation, signals containing data such as voice data or other file data are delivered from the computer 12 to the turbo encoder 14. The turbo encoder 14 encodes the data signal. The turbo encoder 14 is a standard turbo encoder and operates in accordance with turbo encoding principles and methods well known in the art.

The encoded data signal output from the turbo encoder 14 is then interleaved by the channel interleaver 18 in preparation for Walsh encoding, pseudo noise (PN) spreading, and modulation. The channel interleaver 18 may be implemented via a conventional interleaver such as a block interleaver.

The computer 12 also provides a predetermined pilot signal, which in the present specific embodiment is a constant equivalent to 1, to the time division combiner 16 with a control signal. The control signal contains rate control or power control information for delivery to a corresponding receiver (as discussed more fully below) to facilitate power and/or code rate control to maximize communications system efficiency and throughput.

The time division combiner 16 mixes the control signal with the pilot signal in accordance with conventional time division combining methods. The combined signal is input to the second multiplier 26, where it is multiplied by a predetermined Walsh function provided via the second Walsh function generator 28. Similarly, the interleaved data signal output from the channel interleaver 18 is provided to the first multiplier 20 where it is multiplied by another predetermined Walsh function provided by the first Walsh function generator 22.

The resulting Walsh codes output from the first multiplier 20 and the second multiplier 26 are combined via the combiner 24, spread via the PN spreader 30, subsequently modulated and converted to radio frequency by the modulator 32 in preparation for transmission over a channel via the antenna 34.

The resulting signal transmitted via the antenna 34 is a composite signal having a data signal, a pilot signal, and a control signal. Once broadcast over a channel, the composite signal will experience multi-path fading and channel interference that must be efficiently detected and compensated for by the receiver system that receives the transmitted signal.

Those skilled in the art will appreciate that the Walsh functions provided by the first Walsh function generator 22 and the second Walsh function generator 28 may be replaced by pseudo noise function generators or a combination of Walsh function generators and pseudo noise function generators without departing from the scope of the present invention. In addition, the transmitter 10 may be implemented in a base station and/or a mobile station.

In the present detailed description, the terms signal-to-interference and signal-to-noise are equivalent terms.

Figure 2:
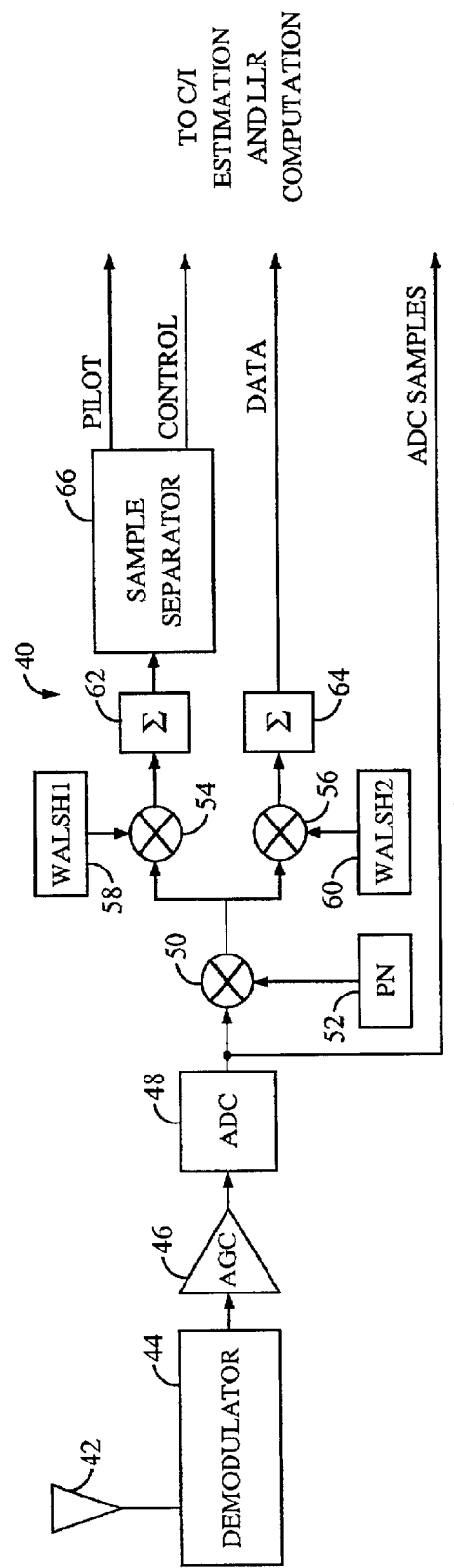
FIG. 2 is a diagram of a CDM receiver of the present invention.

FIG. 2 is a diagram of a CDM receiver 40 of the present invention adapted for use with the CDM transmitter 10 of FIG. 1. The transmitter 40 includes a receiver antenna 42 that is connected to demodulator circuit 44. The demodulator circuit 44 is connected to an automatic gain control circuit 46 that is connected to an analog-to-digital converter (ADC) 48. An output of the ADC 48 is connected to an input of a first receiver multiplier 50. The output of the ADC 48, which represents digital samples, is also provided as input to a C/I Estimation and LLR computation circuit as discussed more fully below.

Another input of the first receiver multiplier is connected to an output of a pseudo noise sequence generator 52. An output of the first receiver multiplier 50 is connected, in parallel, to inputs of a second receiver multiplier 54 and a third receiver multiplier 56. A first receiver Walsh generator circuit 58 and a second receiver Walsh generator circuit 60 also provide input to the second receiver multiplier 54 and the third receiver multiplier 56, respectively. Outputs of the second receiver multiplier 54 and the third receiver multiplier 56 are connected to inputs of a first accumulator 62 and a second accumulator 64, respectively. An output of the first accumulator 62 is connected to a sample separator 66 and despreader that provides output to a carrier signal-to-interference ratio (C/I) estimation circuit and a log-likelihood ratio (LLR) computation circuit as discussed more fully below.

In operation, a signal transmitted over a channel such as the RF signal transmitted by the transmitter 10 of FIG. 1 is received by the antenna 42 of the receiver 40. The received RF signal is converted to an intermediate frequency signal and subsequently converted to a baseband signal via the demodulator 44. The gain of the baseband signal is adjusted via the automatic gain control circuitry 46 and is subsequently converted to a digital signal via the analog-to-digital converter (ADC) 48. Subsequently, the baseband signals are multiplied by a PN sequence that is related to the PN sequence employed in the PN spreader via the PN sequence generator 52 and the first receiver multiplier 50. In the present specific embodiment the PN sequence and its inverse are the same since with binary operations (in GF2) the inverse of 1 is 1 and the inverse of 0 is 0.

Subsequently, the first receiver multiplier 50 outputs a partially despread signal, which is split onto two separate paths. On one path, the second receiver multiplier 54 multiplies the partially spread sequence by a Walsh function provided by first receiver Walsh function generator 58. The provided Walsh function is related to the Walsh function provided by the first Walsh function generator 22 of FIG. 1. The resulting despread signal samples are input to the first accumulator 62, where they are accumulated over a predetermined number of samples. The accumulated despread data samples are provided to the sample separator 66. The sample separator 66 outputs a pilot signal and a control signal extracted from the despread signal to a C/I estimation circuit and LLR circuit as discussed more fully below.

Similarly, despread signal samples output from the third receiver multiplier 56 are accumulated by the second accumulator 64, which outputs a data signal comprising data signal samples to the C/I estimation circuit and LLR circuit as discussed more fully below.

In the present specific embodiment, the present invention is adapted for use with binary phase shift keying (BPSK) or quadrature phase shift keying (QPSK) modulation and demodulation methods, however, those skilled in the art will appreciate that other modulation and demodulation methods may be employed without departing from the scope of the present invention.

Figure 3:
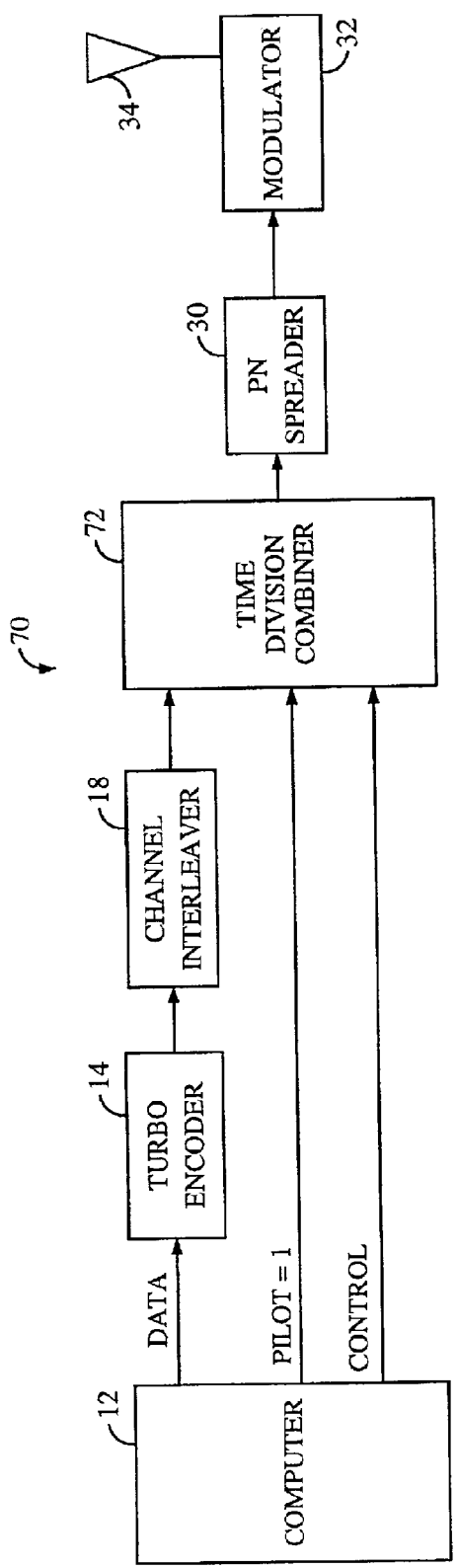
FIG. 3 is a diagram of a time division multiplexing (TDM) transmitter constructed in accordance with the teachings of the present invention.

FIG. 3 is a diagram of a time division multiplexing (TDM) transmitter 70 constructed in accordance with the teachings of the present invention. The TDM transmitter 70 is similar to the CDM transmitter 10 of FIG. 1 with the exception that the time division combiner 16, the multipliers 20 and 26, the Walsh function generators 22 and 28, and the adder 24 of FIG. 1 are replaced by the time division combiner 72.

Figure 4:
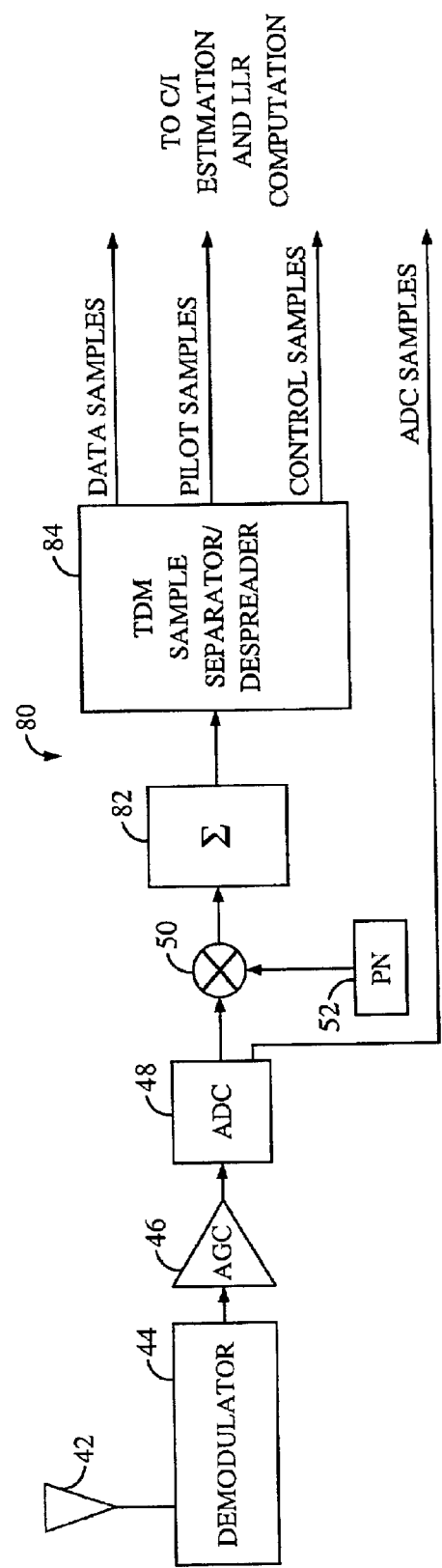
FIG. 4 is a diagram of a TDM receiver of the present invention.

FIG. 4 is a diagram of a TDM receiver 80 of the present invention. The TDM receiver 80 is similar to the CDM receiver 40 of FIG. 2 with the exception that the multipliers 54 and 56, the Walsh function generators 58 and 60, the accumulators 62 and 64, and the sample separator 66 of FIG. 2 are replaced by the accumulator 82 and the TDM sample separator 84. The accumulator 82 receives digital spread samples from the multiplier 50, accumulates the samples, and subsequently provides the accumulated samples to the TDM sample separator 84. The TDM sample separator 84 extracts data samples, pilot samples, and control samples from the accumulated and despread digital signal. The data samples, pilot samples, control samples, and the digital samples output from the ADC 48 are provided to a C/I estimation and LLR circuit as discussed more fully below.

Figure 5:
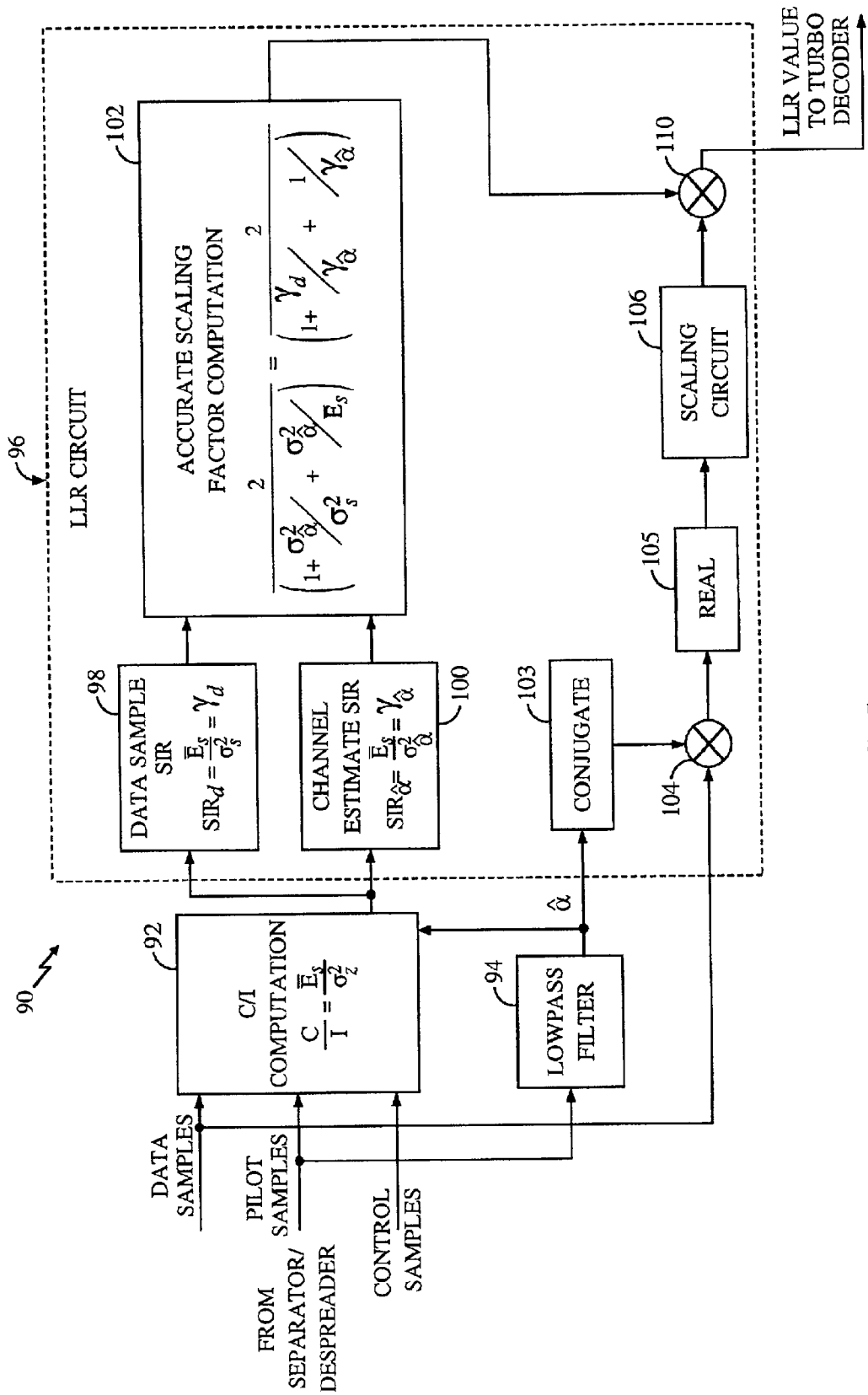
FIG. 5 is a diagram of a circuit for computing a carrier signal-to-interference ratio (C/I) and a log-likelihood ratio (LLR) adapted for use with a forward link and the receivers of FIGS. 2 and 3.

FIG. 5 is a diagram of a circuit 90 for computing a carrier signal-to-interference ratio (C/I) and a log-likelihood ratio (LLR) adapted for use with a forward link and the receivers 40 and 80 of FIGS. 2 and 4, respectively. The circuit 90 includes a carrier signal-to-interference (C/I) computation circuit 92, a lowpass filter 94, and LLR circuit 96.

The C/I computation circuit 92 receives data samples, pilot samples, and control samples as input. An additional channel estimate input is provided via an output of the lowpass filter 94. The lowpass filter 94 is a pilot signal filter that receives the pilot samples, filters the pilot samples, and provides the channel estimate to the C/I computation circuit 92 in response thereto. The C/I computation circuit 92 outputs a C/I ratio to the LLR circuit 96 in response to the receipt of the data samples, pilot samples, and control samples from the receiver of FIG. 2 or 4 and in response to the receipt of the channel estimate from the lowpass filter 94.

The C/I computation circuit 92 may compute the C/I ratio based on information extracted from the data samples, information extracted from the pilot samples, or a combination thereof. If the C/I ratio is computed based on data samples and pilot samples, the C/I computation circuit 92 combines estimates based on the data samples and estimates based on the pilot samples in accordance with following equation:

$$\left(\frac{C}{I}\right)_{out} = \kappa \left(\frac{C}{I}\right)_d + (1-\kappa)\left(\frac{C}{I}\right)_p, \quad [1]$$

where $$\left(\frac{C}{I}\right)_{out}$$

is the C/I ratio output from the C/I computation circuit 92; κ is a predetermined constant that is less than or equal to 1;

$$\left(\frac{C}{I}\right)_d$$

is the C/I ratio based on the data samples; and $$\left(\frac{C}{I}\right)_p$$

is the C/I ratio based on the pilot samples. Systems for providing accurate C/I values are discussed more fully below.

The output of the C/I computation circuit 92 may be expressed as:

$$\left(\frac{C}{I}\right)_{out} = \frac{\overline{E}_s}{\sigma_z^2}, \quad [2]$$

where $\overline{E}_s$ is the average energy per data symbol and $\sigma_z^2$ is the noise variance of the data samples.

The control samples may or may not be used by the C/I computation circuit 92, i.e., C/I estimator. Those skilled in the art will appreciate that the control samples may be omitted without departing from the scope of the present invention. In the present specific embodiment, if the control samples are employed by the C/I estimation circuit 92 then they represent an additional set of data samples similar to the data symbols.

Those skilled in the art will appreciate that data samples, pilot samples and control samples may be provided to the C/I computation circuit as a combined signal without departing from the scope of the present invention. In addition, the control samples may be omitted.

The LLR circuit 96 includes a data sample signal-to-interference ratio (SIR) circuit 98 and a channel estimate SIR circuit 100 that receive $$\left(\frac{C}{I}\right)_{out}$$

from the C/I computation circuit 92. The LLR circuit 96 also includes an accurate scaling factor computation circuit 102 that receives input from the data sample SIR circuit 98 and the channel estimate SIR circuit 100.

The LLR circuit 96 also includes a multiplier 104 that receives the complex conjugate of the channel estimate output from a conjugate circuit 103 connected at the output of the lowpass filter 94 and receives the data samples as input. The real part of the output of the multiplier 104 is computed by a real part extraction circuit 105, the output of which is an approximate scaled LLR estimate of the data bit corresponding to the data sample. An output of the real part extraction circuit 105 is connected to a scaling circuit 106, which scales the output of the real part extraction circuit 105 by a predetermined constant factor and provides an approximate LLR value as output in response thereto. The predetermined constant factor is application-specific and easily determined by those ordinarily skilled in the art to meet the needs of a given application.

An output of the scaling circuit 106 is connected to an input of an LLR multiplier 110, another input of which is connected to an output of the accurate scaling factor computation circuit 102. An output of the LLR multiplier 110 represents an accurate LLR value of the corresponding data sample that is provided to a turbo decoder to facilitate decoding of the data samples as discussed more fully below.

The data sample SIR circuit 98 computes a data sample SIR based on the C/I ratio provided by the C/I computation circuit 92 by multiplying the received C/I ratio by another predetermined scale factor. The scale factor is application-specific and is easily determined by those ordinarily skilled in the art to meet the needs of a given application. The resulting data sample SIR is described by the following equation:

$$\gamma_d = \frac{\overline{E}_s}{\sigma_s^2}, \quad [3]$$

where $\gamma_d$ is the data sample SIR; $\overline{E}_s$ is the average received energy per data symbol; and $$\sigma_s^2$$

noise variance per data sample. The resulting data sample SIR is provided to the accurate scaling factor computation circuit 102.

The channel estimate SIR circuit 100 computes a channel estimate SIR based on the C/I ratio received from the C/I computation circuit 92 by multiplying the received SIR by a predetermined scale factor that is application-specific and easily determined by those ordinarily skilled in the art. The channel estimate SIR is described by the following equation:

$$\gamma_{\hat{\alpha}} = \frac{\overline{E}_s}{\sigma_{\hat{\alpha}}^2}, \quad [4]$$

where $\gamma_{\hat{\alpha}}$ is the channel estimate SIR, $\overline{E}_s$ is the average received energy per data symbol as defined above; and $$\sigma_{\hat{\alpha}}^2$$

is the noise variance per data symbol interval of the channel estimate provided via the lowpass filter 94. The channel estimate SIR is also provided to the accurate scaling factor computation circuit 102.

The accurate scaling factor computation circuit 102 computes an accurate LLR scaling factor based on the data sample SIR provided by the data sample SIR circuit 98 and the channel estimate SIR provided by the channel estimate SIR circuit 100 in accordance with the following equation:

$$k = \frac{2}{\left(1 + \frac{\gamma_d}{\gamma_{\hat{a}}} + \frac{1}{\gamma_{\hat{a}}}\right)}, \quad [5]$$

where k is the accurate LLR scaling factor and the remaining variables are as defined in equations (3) and (4).

The multiplier 104 multiplies the complex conjugate of the channel estimate output from the lowpass filter 94 with the data samples. The result is sent the real part extraction circuit 105 that takes the real part of the product, which is scaled via the scaling circuit 106 by a predetermined constant factor to yield an approximate LLR estimate. The approximate LLR estimate is input to the LLR multiplier 110.

The output of the scaling circuit 106 represents an LLR ratio suitable for use in decoding convolutionally encoded signals, however yields sub-optimal results when used to decode turbo encoded signals.

In accordance with the present invention, the LLR ratio output from the scaling circuit 106 is scaled, via the LLR multiplier 110, by the accurate scaling factor provided by the accurate scaling factor computation circuit 102 and described by equation (5).

The output of the LLR multiplier 110 represents an accurate LLR value that facilitates efficient decoding of turbo encoded signals via a turbo decoder as discussed more fully below.

Figure 6:
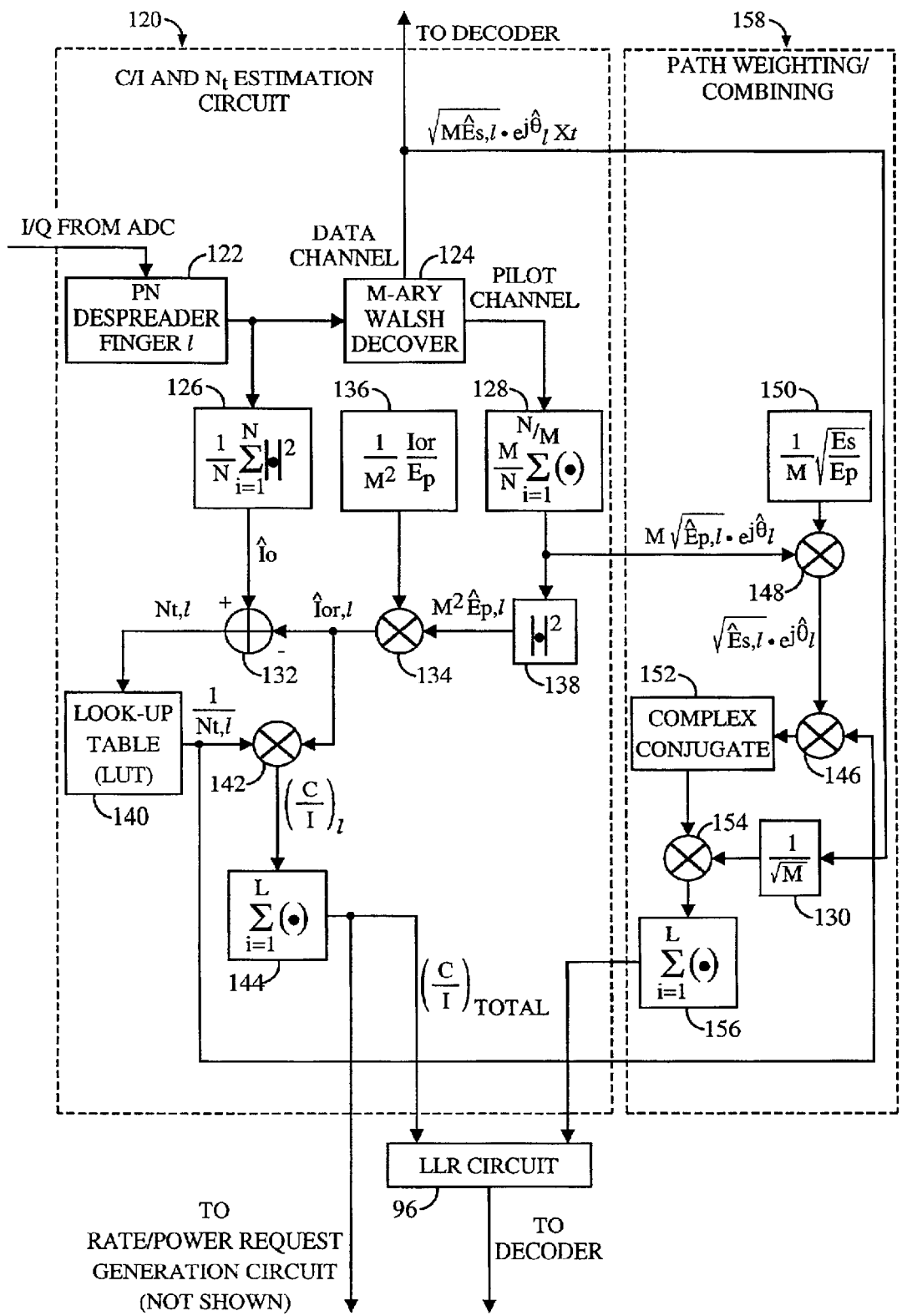
FIG. 6 is a more detailed diagram of a preferred implementation of the C/I computation circuit of FIG. 5.

FIG. 6 is a more detailed diagram of a preferred implementation of a C/I estimation circuit 120, which corresponds to the C/I computation circuit 92 of FIG. 5. The C/I estimation circuit 120 is adapted for use with a forward link. In the present implementation, the C/I estimation circuit 120 includes a PN despreader 122 that replaces the multiplier 50, the PN sequence generator 52, and the accumulator 82 of the receiver 80 of FIG. 4. An M-ary Walsh decover circuit 124 replaces the TDM sample separator 84 of FIG. 4.

The C/I estimation circuit 120 includes, from left to right and top to bottom, the PN despreader 122, an M-ary Walsh decover circuit 124, a total received signal energy ($I_o$) computation circuit 126, a first constant circuit 136, a pilot filter 128, a subtractor 132, a first multiplier 134, a pilot energy calculation circuit 138, a look-up table (LUT) 140, a second multiplier 142, and a C/I accumulation circuit 144. In the C/I estimation circuit 120, the PN despreader 122 receives digital in-phase (I) and quadrature (Q) signals output from the ADC 48 of FIG. 4 or FIG. 5. The PN despreader 122 provides input, in parallel, to the M-ary Walsh decover circuit 124 and the $I_o$ computation circuit 126. The M-ary Walsh decover circuit 124 provides input to the pilot filter 128 and to a constant divider circuit 130 in a path weighting and combining circuit 158.

The output of the energy computation circuit 126 is connected to a positive terminal of the subtractor circuit 132. A negative terminal of the subtractor circuit 132 is connected to an output terminal of a first multiplier 134. A first input of the first multiplier 134 is connected to an output of the first constant circuit 136. A second input of the first multiplier 134 is connected to an output of the pilot energy calculation circuit 138. The pilot filter 128 provides input to the pilot energy calculation circuit 138.

An output of the subtractor 132 is connected to the look-up table (LUT) 140. An output of the LUT 140 is connected, in parallel, to a first input of the second multiplier 142 and a first input of a third multiplier 146 in the path weighting and combining circuit 158. A second input of the second multiplier 142 is connected to the output of the first multiplier 134. An output of the second multiplier 142 is connected to the C/I accumulator circuit 144, the output of which provides input to the LLR circuit 96.

The path weighting and combining circuit 158 includes a second constant generation circuit 150, a fourth multiplier 148, the third multiplier 146, the constant divider circuit 130, a complex conjugate circuit 152, a fifth multiplier 154, and a path accumulator circuit 156. In the path weighting and combining circuit 158, a first terminal of the fourth multiplier 148 is connected to the output of the pilot filter 128, which is also connected to an input of the pilot energy calculation circuit 138 in the C/I estimation circuit 120. A second terminal of the fourth multiplier 148 is connected to the second constant generation circuit 150. An output of the fourth multiplier 148 is connected to a second input of the third multiplier 146. The output of the third multiplier 146 provides input to the complex conjugate circuit 152. The output of the complex conjugate circuit 152 is connected to a first input of the fifth multiplier 154. An output of the constant divider circuit 130 is connected to a second input of the fifth multiplier 154. An output of the fifth multiplier 154 is connected to an input of the path accumulator circuit 156. The output of the path accumulator circuit 156 is connected to a second input of the LLR circuit 96. The output of the LLR circuit is connected to an input of a decoder (see 48 of FIG. 1).

In operation, the PN despreader 122 receives the I and Q signals and despreads L fingers, i.e., L individual paths (I). The PN despreader 122 despreads the I and Q signals using an inverse of the pseudo noise sequence used to spread the I and Q signals before transmission over the channel. The construction and operation of the PN despreader 122 is also well known in the art.

Despread signals are output from the PN despreader 122 and input to the M-ary Walsh decover 124 and the $I_o$ computation circuit 126. The $I_o$ computation circuit 126 computes the total received energy ($I_o$) per chip, which includes both a desired signal component and an interference and noise component. The $I_o$ computation circuit provides an estimate ($\hat{I}_o$) of $I_o$ in accordance with the following equation:

$$\hat{I}_o = \frac{1}{N} \sum_{i=1}^{N} |\cdot|^2 \quad [6]$$

where N is the number of chips per pilot burst and is 64 in the present specific embodiment and • represents the received despread signal output from the PN despreader 122.

Those skilled in the art will appreciate that $I_o$ may be computed before despreading by the PN despreader 122 without departing from the scope of the present invention. For example, the $I_o$ computation circuit 126 may receive direct input from the I and Q signals received from the ADC 48 of FIGS. 2 and 4 instead of input provided by the PN despreader 122, in which case an equivalent estimate of $I_o$ will be provided at the output of the $I_o$ computation circuit 126.

The M-ary Walsh decover circuit 124 decovers orthogonal data signals, called data channels, and pilot signals, called the pilot channel, in accordance with methods known in the art. In the present specific embodiment, the orthogonal data signals correspond to one data channel s that is represented by the following equation:

$$s = \sqrt{M\hat{E}_{s,I}} \cdot e^{j\theta_t} X_t, \quad [7]$$

where M is the number of chips per Walsh symbol, $\hat{E}_{s,I}$ is the modulation symbol energy of the $I^{th}$ multipath component, $\theta_t$ is the phase of the data channel s, and $X_t$ is the information-baring component of the data channel s. The decovered data channel represented by equation (2) is provided to a decoder (as discussed more fully below) and to the constant divider circuit 130 of the path weighting and combining circuit 158.

While the present invention is adapted for use with signals comprising various Walsh codes, the present invention is easily adaptable for use with other types of codes by those ordinarily skilled in the art.

The pilot channel is input to the pilot filter 128. The pilot filter 128 is an averaging filter that acts as a lowpass filter, which removes higher frequency noise and interference components from the pilot channel. The output of the pilot filter 128 p is represented by the following equation:

$$p = M\sqrt{\hat{E}_{p,I}} \cdot e^{j\theta_t} \quad [8]$$

where M is the number of chips per Walsh symbol, $\hat{E}_{p,I}$ is the pilot chip energy of the $I^{th}$ multipath component, and $\theta_t$ is the phase of the filtered pilot channel p.

An estimate of the energy of the filtered pilot channel p is computed via the pilot energy calculation circuit 138, which is a square of the complex amplitude of the filtered pilot channel p represented by equation (8). The square of the complex amplitude of the filtered pilot channel p is multiplied by a predetermined scale factor c described by the following equation:

$$c = \frac{1}{M^2} \frac{I_{or}}{E_p}, \quad [9]$$

where $I_{or}$ is the received energy of the desired signal, i.e., is equivalent to $I_o$ less noise and interference components. $E_p$ is the pilot chip energy. The scale factor c is a known forward link constant in many wireless communications systems.

The scale factor c is multiplied by the energy of the filtered pilot signal p via the first multiplier 134 to yield an accurate estimate $\hat{I}_{or,I}$ of the energy of the received desired signal ($I_o$ less noise and interference components) associated with the $I^{th}$ multipath component of the received signals I and Q signals.

The accurate estimate $\hat{I}_{or,I}$ is subtracted from estimate of $I_o$ via the subtractor 132 to yield an accurate measurement of the interference energy ($N_{t,I}$) associated with the $I^{th}$ multipath component. $N_{t,I}$ is then provided to the LUT 140, which outputs the reciprocal of $N_{t,I}$ to the third multiplier 146 in the path weighting and combining circuit 158 and to the first input of the second multiplier 142. The second input of the second multiplier 142 is connected to the output of the first multiplier 134, which provides $\hat{I}_{or,I}$ at the second input terminal of the second multiplier 142. The second multiplier 142 outputs an accurate estimate of the carrier signal-to-interference ratio $(C/I)_I$ associated with the $I^{th}$ multipath component in accordance with the following equation:

$$\left(\frac{C}{I}\right)_I = \frac{\hat{I}_{or,I}}{N_{t,I}}. \quad [10]$$

The accurate C/I value is then accumulated over L paths in the received signal via the C/I accumulator circuit 144. The accumulated C/I values are then provided to the LLR circuit 96 and to a rate/power request generation circuit (not shown), the construction of which is known in the art.

In the path weighting and combining circuit 158, the fourth multiplier 148 multiplies the filtered pilot signal p by a constant k provided by the second constant generation circuit 150. The constant k is computed in accordance with the following equation:

$$k = \frac{1}{M} \sqrt{\frac{E_s}{E_p}}, \quad [11]$$

where $E_s$ is the modulation symbol energy, $E_p$ is the pilot symbol energy, and M is the number of Walsh symbols per chip as mentioned above. The ratio of $E_s$ to $E_p$ is often known or can be determined for both reverse link and forward link transmissions.

The output of the fourth multiplier 148 provides an estimate of the channel coefficient $\hat{\alpha}$ described by the following equation:

$$\hat{\alpha} = \sqrt{\hat{E}_{s,I}} \cdot e^{j\theta_t}, \quad [12]$$

where $\hat{E}_{s,I}$ is an estimate of the modulation symbol energy of the $I^{th}$ multipath component, $\theta_t$ is an estimate of the phase of the pilot signal.

The channel estimate is then multiplied by the reciprocal of the interference energy $N_{t,I}$ associated with the $I^{th}$ multipath component by the third multiplier 146. The interference energy $N_{t,I}$ includes both interference and noise components. The complex conjugate circuit 152 then computes the conjugate of the output of the third multiplier 146, which represents maximal ratio path combining weights. The maximal ratio path combining weights are then multiplied by the corresponding data symbol output from the divider circuit 130 via the fifth multiplier 154. The data symbol d is represented by the following equation:

$$d = \sqrt{\hat{E}_{s,I}} \cdot e^{j\theta_t} X_t, \quad [13]$$

where the variables are as given for equations (2) and (7).

The output of the fifth multiplier 154 represents optimally weighted data signals that are then accumulated over the L paths that comprise the signals via the path combiner circuit 156. The resulting optimally combined data signals are provided to the LLR circuit 96, which facilitates the calculation of optimal soft decoder inputs to a decoder (as discussed more fully below and shown in FIG. 5).

Note that in FIG. 5 only one path has been shown, so there is no combiner. Otherwise, the data, pilot, and control samples should be interpreted as multiple parallel data streams, each of which is from a different antenna.

Those skilled in the art will appreciate that the constants c and k provided by the first constant generation circuit 136 and the second constant generation circuit 150, respectively, may be constants or variables other than those represented by equations (3) and (6) without departing from the scope of the present invention.

Figure 7:
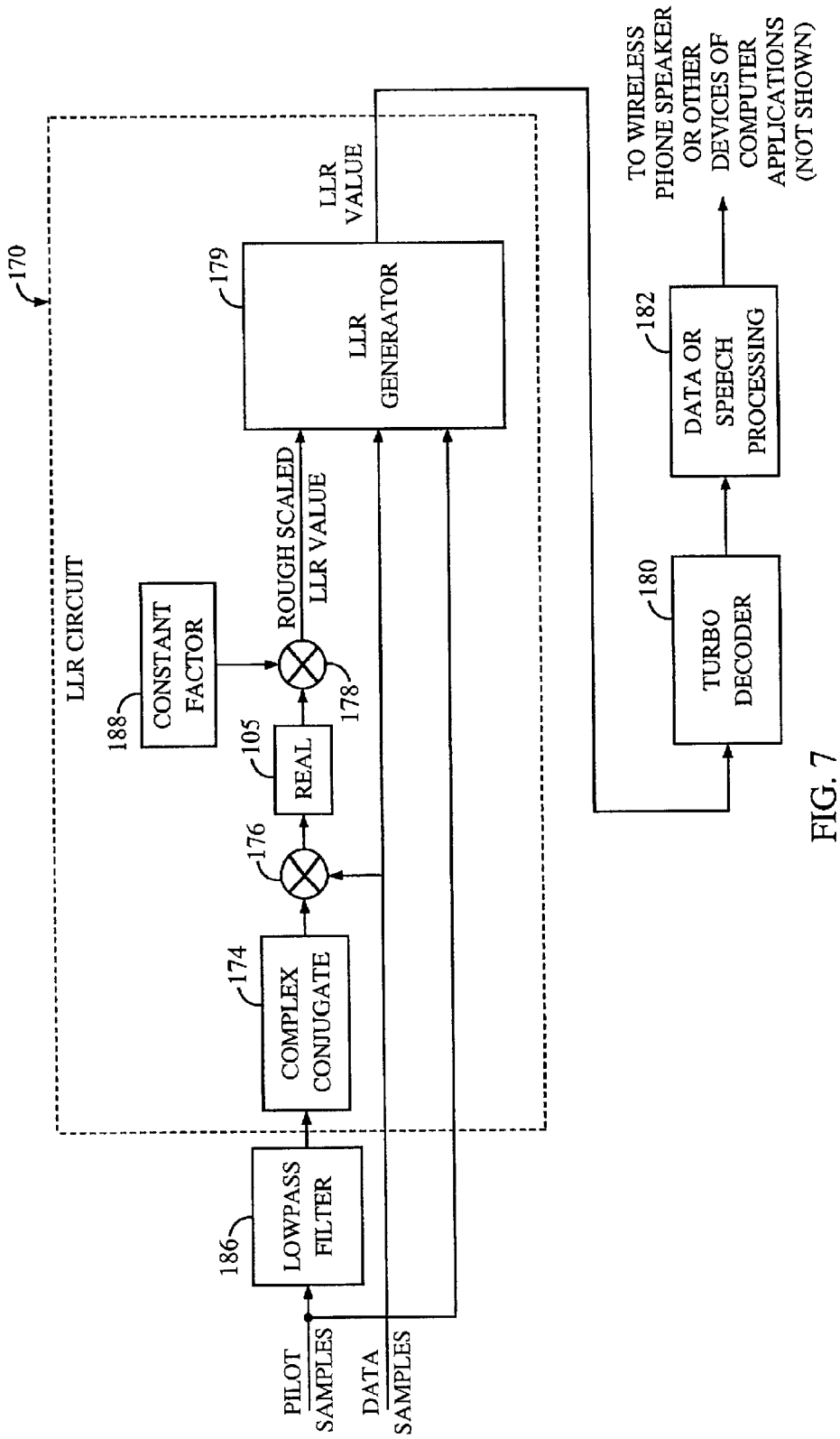
FIG. 7 is a diagram of an LLR circuit and accompanying transceiver circuitry adapted for use with a reverse link and the receivers of FIGS. 2 and 3.

FIG. 7 is a diagram of an LLR circuit 170 adapted for use with a reverse link and the receivers 40 and 80 of FIGS. 2 and 4, respectively. The LLR circuit 170 includes a complex conjugate circuit 174, an output of which is connected to an input of a first multiplier 176. An output of the first multiplier 176 is connected on an input of the real part extraction circuit 105, which provides output to a first input of a second multiplier 178. A second input of the second multiplier 178 is connected to an output of a constant factor circuit 188. An output of the second multiplier 178 is connected to an input of an LLR generator 179 and represents a rough scaled LLR value. The output of the LLR generator 179 is connected to an input of a turbo decoder 180, which provides decoded data bits to a data or speech processing unit 182 connected to a receiver, such as the receiver 40 of FIG. 2 or the receiver 80 of FIG. 3. The data or speech processing unit 182 provides output to w wireless phone speaker (not shown) or to other devices or computer applications (not shown).

Pilot samples and data samples are provided from the receivers of FIG. 2 or FIG. 4 to the LLR generator 179. The pilot samples are also provided as input to a lowpass filter 186, an output of which is connected to an input of the complex conjugate circuit 174.

In operation, pilot samples having been filtered by the lowpass filter 186 are input to the complex conjugate circuit 174 in the LLR circuit 170. The complex conjugate circuit 174 computes the conjugate of the filtered pilot signals and outputs them to the first multiplier 176. The first multiplier 176 multiplies the conjugated and filtered pilot samples with data samples a receiver (see FIGS. 2 and 4). The multiplied signals are then scaled by a predetermined constant factor via the second multiplier 178 and the constant factor circuit 188. The predetermined constant factor is application-specific. Those ordinarily skilled in the art can readily calculate and an appropriate factor and build a corresponding circuit to provide the factor to meet the needs of a given application.

The resulting scaled signal output from the second multiplier 178 is provided to the LLR generator 179, which performs substantially the same functions as the blocks 92, 98, 100, and 102 of FIG. 5.

The output of the LLR generator 179 represents and accurate LLR value, which is input to the turbo decoder 180 as an LLR value suitable for use with turbo codes and applications characterized by relatively low channel signal-to-interference ratios and large multipath spreading factors, such as reverse link applications.

The turbo decoder 180, the construction of which is well known in the art, employs the accurate LLR value to decode the received data samples. The resulting data samples are transferred to signal processing circuitry such as the data or speech processing unit 182 or to a computer connected to the receiver end running data processing software.

In the present embodiment, the controller 182 and transmitter 184 correspond to the computer 12 and the efficient transmitter 10 of FIG. 1, respectively, or the computer 12 and transmitter 70 of FIG. 3.

Figure 8:
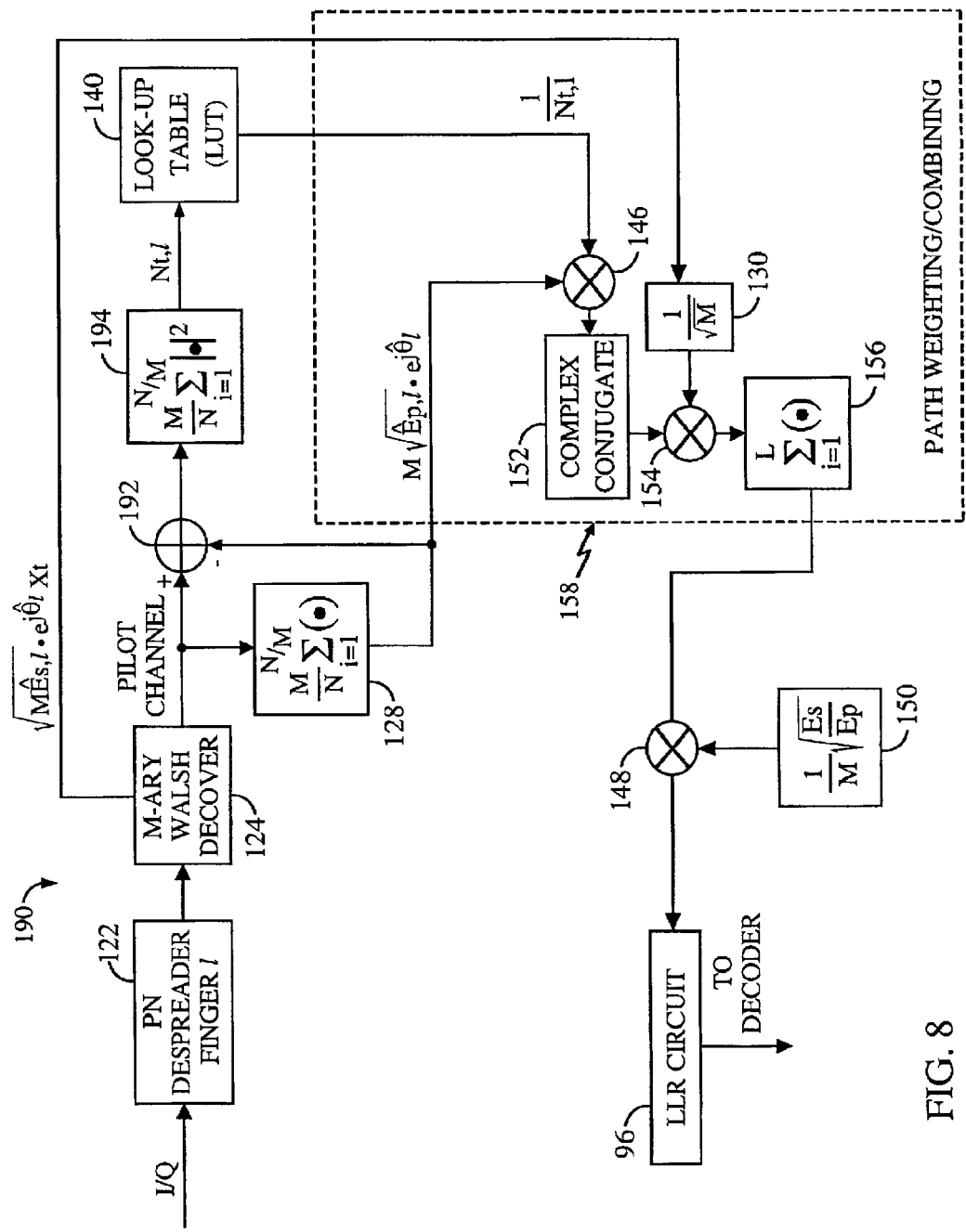
FIG. 8 is a more detailed diagram of a preferred implementation of an interference energy computation circuit and an optimal path combining circuit for providing pilot samples and data samples to the LLR circuit of FIG. 7.

FIG. 8 is a more detailed diagram of a preferred implementation of an interference energy computation circuit 190 and an optimal path combining circuit 158 for providing pilot samples and data samples to the LLR circuit of FIG. 7. The accurate interference energy computation circuit 190 is optimized for reverse link transmission and includes the path weighting and combining circuit 158 and the LLR circuit 96 of FIG. 6.

The operation of the interference energy computation circuit 190 is similar to the operation of the C/I estimation circuit 120 of FIG. 6 with the exception of the calculation of $N_t$. The interference energy computation circuit 190 includes the PN despreader 122, the M-ary Walsh decover circuit 124, and the pilot filter 128. The M-ary Walsh decover circuit 124 decovers, i.e., extracts the pilot channel and the data channel from the despread I and Q signal samples output from the PN despreader 122.

In the interference energy computation circuit 190, the pilot channel is provided to a positive input of a pilot subtractor circuit 192 and to the pilot filter 128. The pilot filter 128 suppresses noise and interference components in the pilot channel and provides a filtered pilot signal to a negative input of the pilot subtraction circuit 192. The pilot subtractor circuit 192 subtracts the pilot channel from the filtered pilot channel and outputs a signal representative of the interference and noise per symbol introduced by the channel between the transmitting base station (not shown) and the transceiver system (see transmitters and receivers of FIGS. 1 and 2 and FIGS. 3 and 4) in which the interference energy computation circuit 190 is employed. The energy ($N_{t,I}$) of the interference and noise signal for each symbol is computed via an interference energy computation circuit 194 in accordance with the following equation:

$$N_{t,I} = \frac{M}{N}\sum_{i=1}^{\frac{N}{M}} |\cdot|^2, \qquad [14]$$

where M is the number of chips per Walsh symbol, N is the number of chips (64 chips) in the pilot burst, and • is the output of the pilot subtractor circuit 192.

The interference energy computation circuit 190 is employed when the constant value c provided by the first constant generation circuit 84 of FIG. 6 is not known. The constant k used by multiplier 148 may not be known by the time the symbols are demodulated on the reverse link. Thus, in FIG. 8, the multiplication is performed right before the LLR computation and decoding. This is the case with many reverse link applications.

Figure 9:
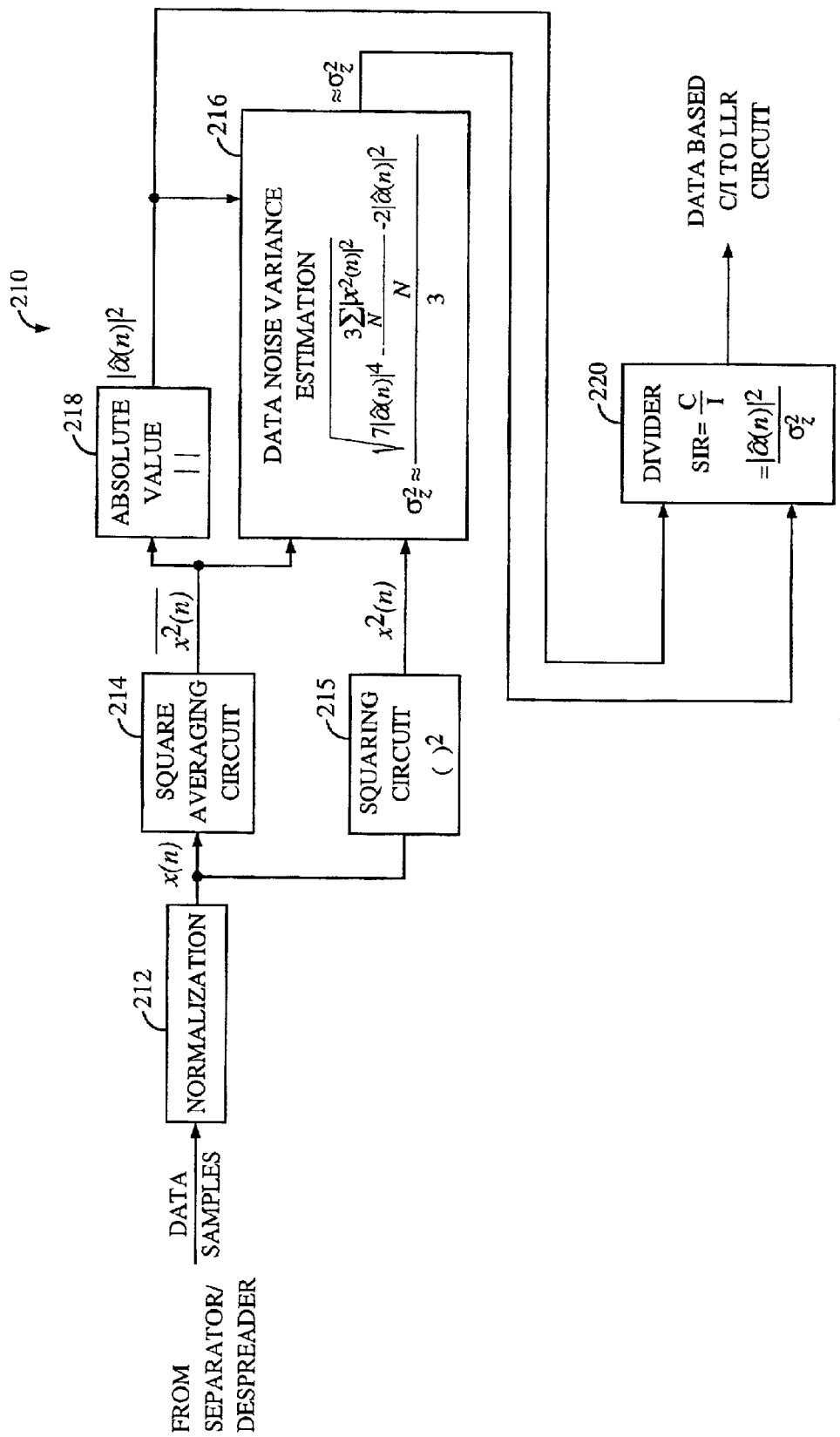
FIG. 9 is a diagram of an alternative embodiment of a C/I computation circuit adapted for use with the circuit of FIG. 5.

FIG. 9 is a diagram of an alternative embodiment of a C/I computation circuit 210 adapted for use with the circuit 90 of FIG. 5. The C/I computation circuit 210 is a specific implementation of the C/I computation circuit 92 of FIG. 5. The C/I computation circuit 210 may be used in conjunction with or instead of the C/I estimator 120 of FIG. 6.

The C/I computation circuit 210 is adapted for use with forward link applications and includes a normalization circuit 212. The normalization circuit 212 is connected, in parallel, to a square averaging circuit 214 and a squaring circuit 215. An output of the squaring circuit 215 is connected to a noise variance estimate circuit 216. The square averaging circuit 214 is connected in parallel to an absolute value circuit 218 and the noise variance estimate circuit 216. An output of absolute value circuit 218 is connected, in parallel, to the noise variance estimate circuit 216 and to a first input of a divider 220. A second input of the divider 220 is connected to an output of the noise variance estimate circuit 216.

In operation, received data samples are normalized by the normalization circuit 212 by a predetermined and application-specific normalization factor, which is easily determined by those ordinarily skilled in the art to meet the needs of a given application. The normalized data samples are provided to the square averaging circuit 214 that computes the average of the square of the complex normalized data samples. The normalized data samples are also squared by the squaring circuit 215 and provided to the noise variance estimate circuit 216. The output of the square averaging circuit 214 represents an estimate of the energy of the data samples and is also input to the noise variance estimate circuit 216, which computes an estimate of the noise variance of the data samples in accordance with the following equation:

$$\sigma_z^2 = \frac{-2|\hat{\alpha}(n)|^2 + \sqrt{4|\hat{\alpha}(n)|^4 - 3\left[\frac{3\sum_N |x^2(n)|^2}{N - |\overline{x^2(n)}|^2}\right]}}{3} \quad [15]$$

$$\approx \frac{\sqrt{7|\hat{\alpha}(n)|^4 - \frac{3\sum_N |x^2(n)|^2}{N}} - 2|\hat{\alpha}(n)|^2}{3},$$

where $$\sigma_z^2$$

is the noise variance of the normalized data sample; $|\hat{\alpha}(n)|^2$ is an absolute value of the output of the square averaging circuit, i.e., the output of the absolute value circuit 218; $x^2(n)$ represents the output of the square averaging circuit; n is a discreet time variable; and N is a number of data samples over which the noise variance of the data samples is computed. N is application-specific and easily determined by those ordinarily skilled in the art to meet the needs of a given application.

The resulting noise variance of the channel estimate is output to a divider 220 that divides the square of the absolute value of the channel estimate, i.e., the output of the absolute value circuit 218 by the noise variance $$\sigma_z^2$$

to yield a relatively accurate data sample based C/I ratio. The resulting primary signal-to-noise ratio, i.e., the data based C/I ratio is combined with pilot estimated C/I ratio generated, e.g., by 120 of FIG. 6, to generate a combined C/I estimate according to equation (1). The combined C/I estimate is input to the data sample SIR circuit 98 of FIG. 5 and the channel estimate SIR circuit 100 of FIG. 5.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. A method for an efficient telecommunications receiver system for accurately decoding a received composite signal having data signal and pilot signal components comprising:
   receiving said composite signal and extracting a pilot signal and a data signal therefrom;
   calculating a log-likelihood ratio as a function of a channel estimate based on said pilot signal; and
   scaling said log-likelihood ratio by a predetermined log-likelihood ratio scaling factor and providing an accurate log-likelihood value in response thereto and computing a primary carrier signal-to-interference ratio; and
   decoding said received composite signal based on said accurate log-likelihood value and said data signal.

2. The method of claim 1 wherein said pilot signal and said data signal comprise pilot samples and data samples, respectively.

3. The method of claim 1 further comprising despreading said received composite signal in accordance with a predetermined spreading function and providing a despread signal in response thereto.

4. A method for providing an accurate log-likelihood value to improve receiver performance for a wireless communications system, comprising:
   extracting a pilot signal and a data signal from a received composite signal;
   computing a carrier signal-to-interference ratio based on said pilot signal and said data signal and providing a first signal-to-interference ratio and a second signal-to-interference ratio based in response thereto;
   computing a log-likelihood ratio scaling factor based on said first signal-to-interference ratio and said second signal-to-interference ratio;
   calculating a log-likelihood ratio as a function of a channel estimate based on said pilot signal; and
   scaling said log-likelihood ratio by said log-likelihood ratio scaling factor and providing said accurate log-likelihood value in response thereto.

5. A method for increasing a signal-to-noise ratio of a receiver employing reference symbol aided demodulation, comprising:
   combining information from a reference signal transmitted over a channel with information from a corresponding known transmitted reference signal to obtain an estimate of said channel over which said reference symbol is transmitted by a transmitter and received by said receiver;
   calculating a log-likelihood ratio estimate for a data signal received by said receiver over said channel, said log-likelihood ratio estimate being a function of said received data signal, said channel estimate, and a noise variance of said signal;
   applying a scaling factor to said log-likelihood ratio estimate to provide an accurate log-likelihood ratio, said scaling factor based on a noise variance of said channel estimate, said noise variance of said data signal, and an average of received energy per bit in said data signal; and
   employing said accurate log-likelihood value to demodulate said received data signal.

6. A method for a communication system employing pilot assisted coherent demodulation, comprising:
   encoding a data signal in accordance with a Turbo code and transmitting said data signal with a pilot signal;
   receiving said data signal and said pilot signal and providing an estimate of said channel based on said received pilot signal based on a turbo decoding and a priori knowledge of said pilot signal;
   generating an accurate log-likelihood ratio that is a function of a noise variance of said data signal, a noise variance of said estimate of said channel, an average received energy per information bit included in said data signal, and said data signal; and
   employing said log-likelihood ratio as a metric to demodulate said received data signal.

* * * * *